United States Patent [19]

Tsuchiya et al.

[11] 4,383,326

[45] May 10, 1983

[54] CLOCKING SIGNAL DRIVE CIRCUIT FOR BUCKET BRIGADE DEVICE

[75] Inventors: Takao Tsuchiya; Mitsuo Soneda, both of Fujisawa; Isa Nakamura, Atsugi, all of Japan

[73] Assignee: Sony Corporation, Tokyo, Japan

[21] Appl. No.: 211,111

[22] Filed: Nov. 28, 1980

[30] Foreign Application Priority Data

Dec. 3, 1979 [JP] Japan .............................. 54-156633

[51] Int. Cl.$^3$ ..................... G11C 19/20; H03K 19/092
[52] U.S. Cl. ........................................ 377/61; 377/60; 377/78; 307/481; 333/165
[58] Field of Search ............... 307/221 C, 221 D, 480; 333/165

[56] References Cited

U.S. PATENT DOCUMENTS 3,794,856 2/1974 Baker .............................. 307/221 C

Primary Examiner—John S. Heyman
Attorney, Agent, or Firm—Lewis H. Eslinger; Alvin Sinderbrand

[57] ABSTRACT

A bucket brigaded device is provided which includes first and second clocking signal generators for generating a first set and a second set of clocking signals respectively, a plurality of successive capacitors for sequentially holding charge level representing an input signal, and a plurality of transistors for controlling the transfer of charge levels from one capacitor to another. Each of the transistors is connected between adjacent capacitors.

The bucket brigaded device further comprises a first clocking signal driver for supplying one of the first set of clocking signals to each capacitor, and a second clocking signal driver for supplying one of the second set of clocking signals to each transistor.

4 Claims, 19 Drawing Figures

FIG. 4A  $\phi_{1a}$

FIG. 4B  $\phi_{2a}$

FIG. 4C  $\phi_{1b}$

FIG. 4D  $\phi_{2b}$

FIG. 5A  $\phi_{1a}$  $V_P$

FIG. 5B  $\phi_{2a}$  $V_P$

FIG. 5C  $\phi_{1b}$  $V_{DC}+V_B$ / $V_{DC}$

FIG. 5D  $\phi_{2b}$  $V_{DC}+V_B$ / $V_{DC}$

FIG. 5E  $V_{DC}+V_B+\frac{C}{C+C_S}V_P$ / $V_S$ / $V_{DC}+V_B$

FIG. 5F  $V_{DC}+V_B+\frac{C}{C+C_S}V_P$ / $V_S$ / $V_{DC}+V_B$

CLOCKING SIGNAL DRIVE CIRCUIT FOR BUCKET BRIGADE DEVICE

BACKGROUND OF THE INVENTION

1. Field of the Invention

This invention relates generally to bucket brigaded devices, and more particularly is directed to an improved clocking signal drive circuit for the bucket brigaded devices.

2. Description of the Prior Art

In the prior art, bucket brigaded devices (BBDs) are well known which include a series of capacitors, each having a transfer plate and a clocking plate, and each being capable of holding a variable amount of charge. The transfer plate of each capacitor is connected to the transfer plate of the preceding capacitor through a transfer transistor. The clocking plate of each capacitor and the base of each transfer transistor are supplied with a respective one of a plurality of clocking signals. An input signal voltage is applied across the first capacitor in the series of capacitors to place a voltage having a corresponding signal level on the first capacitor. The voltages of the clocking signals are then varied so that the transfer transistor between the first and the second capacitors is turned on. As a result, charge flows from the second capacitor, which is originally charged with a standard voltage level higher than the signal level, to the first capacitor. This charge transfer continues until the voltage across the first capacitor is raised from the signal level to the standard level at which point the voltage at the transfer plate of the first capacitor equals the voltage of the clocking signal supplied to the base of the transfer transistor which causes the transfer transistor to be turned off. This transfer of charge causes the voltage across the second capacitor, which has the same capacitance as the first, to drop from the standard level to the signal level. This process is repeated under the control of the clocking signals, so that the signal level originally placed on the first capacitor is sequentially transferred from one capacitor to another, enabling the BBD to store or delay for a desired length of time the input signal applied to its first capacitor.

In the above described conventional BBDs, since the clocking signal is common to the capacitor and the transfer transistor, there are several defects, which will be described below, by way of example.

1. On the one hand, the dynamic range of the input signal depends on the level of the clocking signal, so that it would be desirable to raise the level of the clocking signal in order to get a large dynamic range. On the other hand, a reverse bias voltage, which also depends on the level of the clocking signal, is applied across, for example, the base-emitter junction of the transistor at a certain phase of the clocking signal, and this reverse bias may not exceed the reverse breakdown voltage of the transistors. In this respect, the dynamic range of the input signal is limited by the reverse breakdown voltage of the transistor and can not be increased in the conventional BBD.

2. Since the clocking signal generator has an output impedance, even if it may be very small, a clocking signal causing a current to flow through a given segment of the BBD causes a change in the level of the clocking signal supplied to the control electrode of the transistors of the other segments. Therefore, the mutual interference between the segments causes distortion, impaired signal-to-noise ratio, and the like, in the output signal.

3. If a recursive filter is formed using the conventional BBD, the efficiency of the components forming this filter can not be selected to be great enough.

OBJECTS AND SUMMARY OF THE INVENTION

Accordingly, it is an object of this invention to provide a bucket brigaded device that avoids the above described difficulties encountered with the bucket brigaded devices in the prior art.

It is another object of this invention to provide a bucket brigaded device that has a relatively larger dynamic range for the input signal.

It is still another object of this invention to provide a bucket brigaded device of which the signal-to-noise ratio of the output signal is relatively high.

It is a further object of this invention to provide a bucket brigaded device for use in a transversal filter, in which the components forming a part of the filter can be operated with high efficiency.

According to one embodiment of this invention, a bucket brigaded device comprises first and second clocking signal generators for generating a first set and a second set of clocking signals, a plurality of successive capacitors for holding charges, a plurality of transistors for controlling the transfer of charge from one capacitor to another, each of which transistors is connected between adjoining capacitors, a first clocking signal driver for supplying one of the first set of plural clocking signals to each capacitor, and a second clocking signal driver for supplying one of the second set of plural clocking signals to each transistor.

The above, and other objects, features and advantages of the present invention will be apparent from the following description taken in conjunction with the accompanying drawings.

DESCRIPTION OF THE PREFERRED EMBODIMENTS

For better understanding of this invention, a prior art bucket brigaded device (BBD) will first be described with reference to FIG. 1 and FIGS. 2A to 2D.

Figure 1:
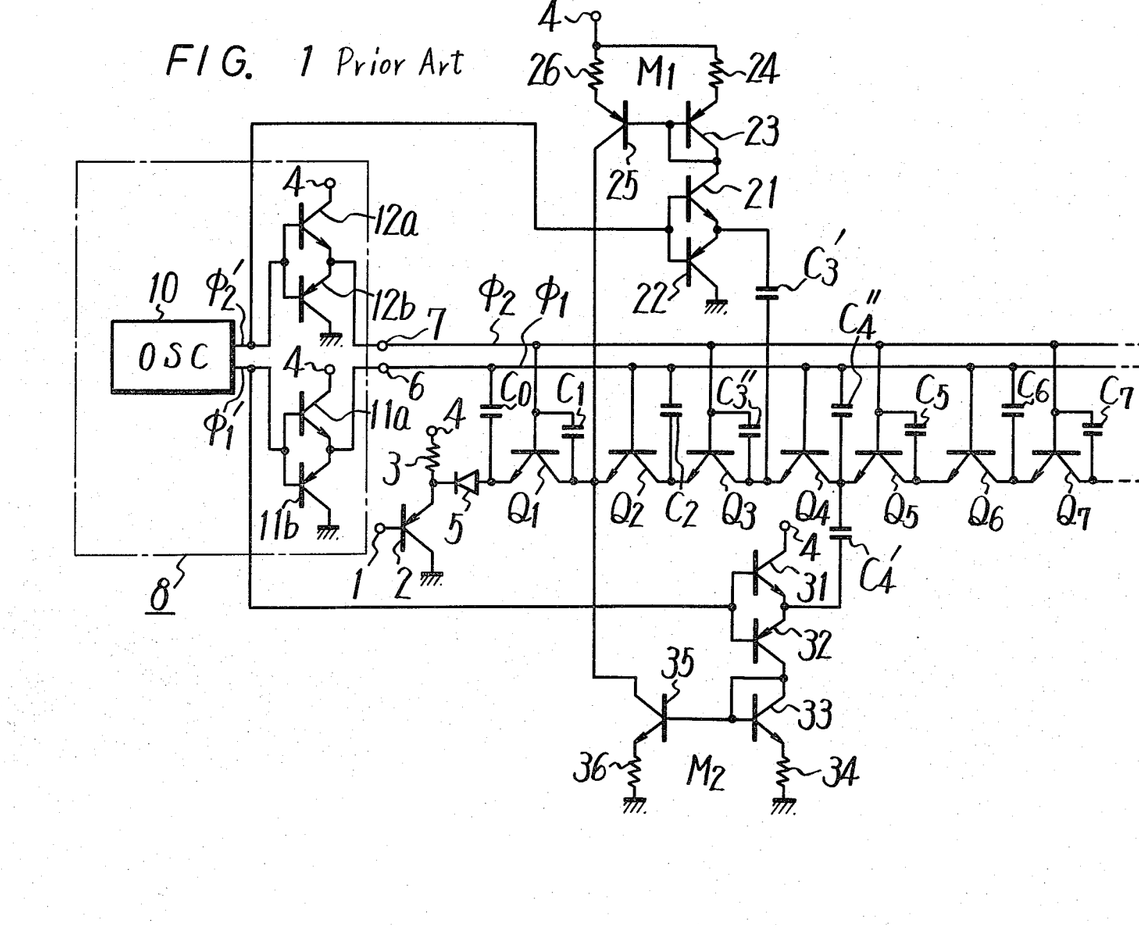
FIG. 1 is a schematic diagram showing one example of a prior art bucket brigaded device.

FIG. 1 shows a circuit arrangement of a prior art BBD, in which an input terminal 1 is connected to the base of pnp-type transistor 2. The emitter of transistor 2 is connected through a resistor 3 to a voltage source or terminal 4, and the collector thereof is grounded. The emitter of transistor 2 is also connected to the cathode of a diode 5, the anode of which is connected to one end (hereinafter called the "hot side") of a capacitor $C_0$. The other end of capacitor $C_0$ is connected to a clock terminal 6. The hot side of capacitor $C_0$ is also connected to the emitter of an npn-type transistor $Q_1$ the collector of which is connected to the emitter of a next npn-type transistor $Q_2$. In a similar manner, the collectors and emitters of npn-type transistors $Q_1$ through $Q_{2n}$, where n is zero or a positive integer, are connected in series. Between the respective collectors and bases of each of these transistors $Q_1$ to $Q_{2n}$ there are connected capacitors $C_1$ to $C_{2n}$. The capacitance of capacitors $C_1$ to $C_{2n}$ equals that of capacitor $C_0$, which will be referred to as C. Further the bases of odd-numbered transistors $Q_1$, $Q_3$–$Q_{2n-1}$ are connected through a clock terminal 7 to a clock signal generator 8, while the bases of even-numbered transistors $Q_2$, $Q_4$–$Q_{2n}$ are connected through clock terminal 6 to the same clock signal generator 8.

The clock terminals 6 and 7 are respectively supplied with clock signals $\phi_1$ and $\phi_2$ (FIGS. 2A and 2B) which are opposite in polarity and oscillate between $V_{DC}$ and $V_{DC}+V_P$ with a duty cycle of 50%. With respect to the clocking voltage $V_{DC}$ and the source voltage $V_{CC}$ supplied to terminal 4, the voltage $V_P$ is selected as follows:

$$V_{CC} < V_{DC} + \frac{2C + C_S}{C + C_S} V_P$$

where $C_S$ is a parasitic capacitance in parallel with each capacitor. Further, an input signal voltage $V_S$ supplied to input terminal 1 is selected in a range of $$V_{DC} + V_P \leq V_S \leq V_{DC} + \frac{2C + C_S}{C + C_S} V_P$$

In the described BBD, the capacitors $C_0$ to $C_{2n}$ are initially charged with a voltage $$\frac{C}{C + C_S} V_P.$$

If the input voltage $V_S$ is divided into DC component $V_{SDC}$ and AC component $V_{SAC}$, the AC component $V_{SAC}$ is initially zero, and $V_S$ is equal to $V_{SDC}$.

Accordingly, given this initial condition, when signal $\phi_1$ is increased to $V_{DC}+V_P$, the potential at the hot side of even-numbered capacitors $C_0$, $C_2$–$C_{2n}$ is first increased to $V_{DC}+$ $$\frac{2C + C_S}{C + C_S} V_P$$

and then lowered to $V_{SDC}$, as shown in FIG. 2C. When signal $\phi_2$ is increased to $V_{DC}+V_P$, the potential is across the even-numbered capacitors is first lowered to $$V_{SDC} - \frac{C}{C + C_S} V_P$$

and then increased to $V_{DC}+V_P$. Further, when signal $\phi_1$ is increased to $V_{DC}+V_P$, the potential at the hot side of odd-numbered capacitors $C_1$, $C_3$–$C_{2n-1}$, as shown in FIG. 2D, is first lowered to $$V_{SDC} - \frac{C}{C + C_S} V_P.$$

and then increased to $V_{DC}+V_P$. Where signal $\phi_2$ rises to $V_{DC}+V_P$, the potential is first increased to $$V_{DC} + \frac{2C + C_S}{C + C_S} V_P$$

and then lowered to $V_{SDC}$.

If the first signal $\phi_1$ is increased to the level $V_{DC}+V_P$ immediately after an input signal $V_S$ is supplied, having a voltage of $V_{S1}$, the potential at the hot end side of capacitor $C_0$ is first increased to $$V_{DC} + \frac{2C + C_S}{C + C_S} V_P$$

and then lowered to $V_{S1}$. In other words, the capacitor $C_0$ is discharged to store an electric charge of $\{V_{S1}-(V_{DC}+V_P)\}C$. In this case, the transistor $Q_1$ is nonconductive and hence no change occurs in capacitors $C_1$, $C_2$–$C_{2n}$.

Next, when the signal $\phi_2$ rises to the level $V_{DC}+V_P$, the potential at the hot side of capacitor $C_0$ is lowered to $$V_{S1} - \frac{C}{C + C_S} V_P.$$

In this case, the transistor $Q_1$ is turned on and hence the potential at the hot side of capacitor $C_0$ is increased to the base potential $V_{DC}+V_P$ of transistor $Q_1$. Since the transistor $Q_1$ is conductive at this time, the capacitor $C_0$ is charged through a path from terminal 7 through capacitor $C_1$ and the collector emitter junction of transistor $Q_1$ to capacitor $C_0$. Since the potential of capacitor $C_0$ at its hot side changes from $$V_{S1} - \frac{C}{C + C_S} V_P \text{ to } V_{DC} + V_P,$$

the transfer of electric charge from the hot side of capacitor $C_1$ to the hot side of capacitor $C_0$ is given by $$\left\{ (V_{DC} + V_P) - \left( V_{S1} - \frac{C}{C + C_S} \right) \right\} C =$$

$$\left( V_{DC} + \frac{2C + C_S}{C + C_S} V_P - V_{S1} \right) C.$$

Meanwhile, since the electric charge of $$\frac{C}{C + C_S} V_P \cdot C$$

was initially stored in capacitor $C_1$, the final electric charge of capacitor $C_1$ reaches the amount of $$\frac{C}{C + C_S} V_P \cdot C - \left( V_{DC} + \frac{2C + C_S}{C + C_S} V_P - V_{S1} \right) C =$$

$$\{V_{S1} - (V_{DC} + V_P)\}C.$$

In other words, the potential $V_{S1}-(V_{DC}+V_P)$ which existed across capacitor $C_0$ during the interval when signal $\phi_1$ was at a level of $V_{DC}+V_P$ moves to capacitor $C_1$ during the interval where signal $\phi_2$ is $V_{DC}+V_P$, and the potential of capacitor $C_0$ returns to $V_{DC}+V_P$. In this case, the transistor $Q_2$ is nonconductive and hence no change appears in capacitors $C_2$, $C_3$–$C_{2n}$.

Further, when signal $\phi_1$ is again at the level $V_{DC}+V_P$, and the input signal voltage $V_S$ equals $V_{S2}$, for example, the capacitor $C_0$ is charged to $V_{S2}-(V_{DC}+V_P)$, the capacitor $C_1$ is returned to the level of $V_{DC}+V_P$, and the capacitor $C_2$ is charged to $V_{S1}-(V_{DC}+V_P)$. In this case, the transistor $Q_3$ is nonconductive and hence no change appears in the capacitors $C_3$ et seq.

When the above operation is repeated, each successive input signal is transferred to synchronism with signals $\phi_1$ and $\phi_2$ from left to right in the figure.

In this circuit, however, the maximum reverse voltage applied between the emitter and base of transistors $Q_1$, $Q_2$–$Q_{2n}$ becomes as follows:

$$\left\{ V_{DC} + \left(1 + \frac{C}{C+C_S}\right) V_P \right\} - V_{DC} = \frac{2C+C_S}{C+C_S} V_P.$$

And if the reverse breakdown voltage between the emitter and base of transistors $Q_1$, $Q_2$–$Q_{2n}$ is taken to be $V_{EBO}$, the following relation must be kept:

$$\frac{2C+C_S}{C+C_S} V_P < V_{EBO}$$

$$V_P < \frac{C+C_S}{2C+C_S} V_{EBO}.$$

On the other hand, the maximum dynamic range D of the signals $V_S$ flowing through the BBD is expressed as follows:

$$D = \frac{C}{C+C_S} V_P - V_{CEmin}$$

where $V_{CEmin}$ is the minimum collector-emitter potential for activating transistors $Q_1$, $Q_2$–$Q_{2n}$.

From the above equations, the following relation is obtained:

$$D < \frac{C}{C+C_S} \cdot \frac{C+C_S}{2C+C_S} V_{EBO} - V_{CEmin}$$

$$D < \frac{C}{2C+C_S} V_{EBO} - V_{CEmin}.$$

As a result, a large dynamic range D can not be obtained.

In the above-mentioned circuit, when the electric charge is transferred from capacitor $C_3$ to capacitor $C_2$ during an interval where, for example, the signal $\phi_2$ is at the level $V_{DC}+V_P$, a signal current flows from terminal 7 through a path from capacitor $C_3$ through the collector-emitter junction of transistor $Q_3$ and capacitor $C_2$ to terminal 6. Since the clock signal generating circuit 8 has an impedance in this case, the potential of clock signal $\phi_1$ will vary according to the impedance and the signal current. But, if the potential of clock signal $\phi_1$ changes in this way, the base potentials of transistors $Q_2$, $Q_4$– will be varied, causing mutual interference between signals stored in adjacent capacitors, which may cause distortion of the waveform of the signals or the like.

In the clock signal generator 8 of FIG. 1, there is provided an oscillator 10 for producing signals $\phi_1'$ and $\phi_2'$ which are in phase with signals $\phi_1$ and $\phi_2$ and have potentials of $V_{DC}-V_{BE}$ and $V_{DC}+V_P+V_{BE}$, respectively, where $V_{BE}$ is the base-emitter voltage of a transistor. An output terminal providing signal $\phi_1'$ from oscillator 10 is connected to, for example, the bases of complementary transistors 11a and 11b, and the emitters of transistors 11a and 11b are connected to each other. The collector of npn-type transistor 11a is connected to the terminal 4 to which the source voltage is applied, while the collector of pnp-type transistor 11b is grounded. Similarly, an output terminal providing signal $\phi_2'$ is connected to the bases of complementary transistors 12a and 12b. A connection point of the emitters of transistors 11a and 11b is connected to the terminal 6 and a connection point of the emitters of transistors 12a and 12b is connected to the terminal 7.

In the BBD as described above, a recursive type filter will be normally provided in the following manner. In FIG. 1, an odd-numbered capacitor, for example, capacitor $C_3$, is divided into two capacitors $C_3'$ and $C_3''$ respectively having capacitance values of $a_3C$ and $(1-a_3)C$. One capacitor $C_3''$ is connected at its cold side to the terminal 7. Complementary transistors 21 and 22 have their emitters connected to each other with a connection point thereof being connected to the cold side of capacitor $C_3'$. The bases of transistors 21 and 22 are connected to each other with a connection point therebetween being connected to the oscillator 10 so that the signal $\phi_2'$ is supplied to the bases of transistors 21 and 22. The collector of pnp-type transistor 22 is grounded, and the collector of npn-type transistor 21 is connected to the collector and base of a pnp-type transistor 23. This transistor 23 forms a first current mirror circuit $M_1$ together with another pnp-type transistor 25. The emitter of transistor 23 is connected through a resistor 24 to the terminal 4 and the emitter of transistor 25 is also connected through a resistor 26 to the terminal 4. The base of transistor 25 is connected to the base of transistor 23. The resistors 24 and 26 are used merely for correcting any mismatch of transistors 23 and 25 and so they may be unneccessary. The collector of transistor 25 is connected to the hot side of capacitor $C_1$.

Further, an even-numbered capacitor, for example, capacitor $C_4$, is divided into two capacitors $C_4'$ and $C_4''$ respectively having capacitance values of $a_4C$ and $(1-a_4)C$. The capacitor $C_4''$ is connected at its cold side to the terminal 6. There are provided another pair of complementary transistors 31 and 32 having emitters connected to each other with a connection point therebetween being connected to the cold side of capacitor $C_4'$. The bases of transistors 31 and 32 are connected to each other with a connection point therebetween being connected to the oscillator 10 so that the signal $\phi_1'$ is supplied to the bases of transistors 31 and 32. The collector of npn-type transistor 31 is connected to the terminal 4, and the collector of pnp-type transistor 32 is connected to the collector and base of an npn-type transistor 33. The transistor 33 forms a second current mirror circuit $M_2$ together with another npn-type transistor 35. The emitters of transistors 33 and 35 are respectively grounded through resistors 34 and 36. The base of transistor 35 is connected to the base of transistor 33 and the collector of transistor 35 is connected to the hot side of capacitor $C_1$. The resistors 34 and 36 are used for correcting any mismatch of transistors 33 and 35 and hence they may be unneccessary.

In the recursive-type filter as described above, the transistor pair 11a and 11b and the pair 12a and 12b forming clock signal generator 8 are symmetrically connected between terminal 4 and ground with respect to the terminals 6 and 7. Therefore, if the center potential of signals $\phi_1$ and $\phi_2$ is set at $\frac{1}{2}$ of the source voltage $V_{CC}$, that is, $V_{DC}+\frac{1}{2}V_P=V_{CC}/2$, the efficiency of transistors 11a, 11b, 12a and 12b can be utilized to the maximum.

Also, the transistors 25 and 35 forming current mirror circuits $M_1$ and $M_2$ are symmetrically connected between terminal 4 and ground with respect to the hot side of capacitor $C_1$. Therefore, if the center potential of the signal at the hot side of capacitor $C_1$ is set at $V_{CC}/2$, the efficiency of transistors 25 and 35 can be utilized to the maximum.

Figure 2A:
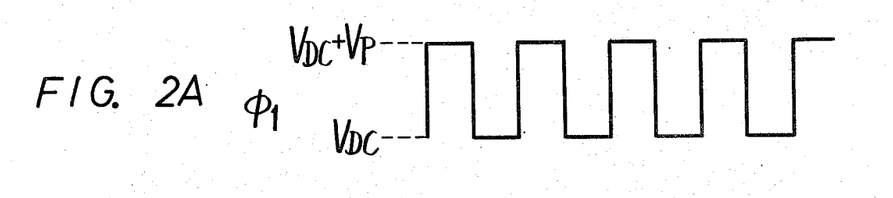
FIGS. 2A to 2D are views showing waveforms used for explaining the device of FIG. 1.
Figure 2B:
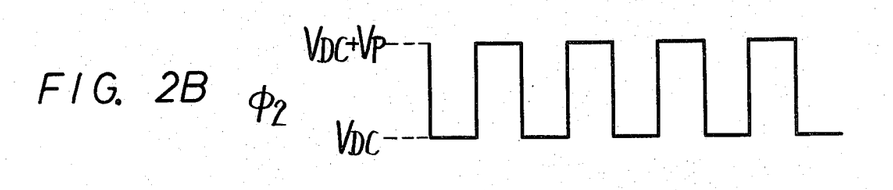
Figure 2C:
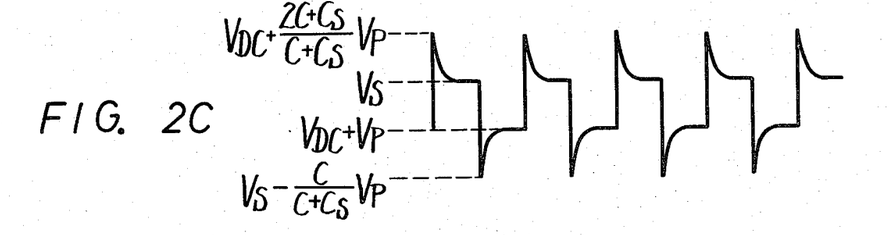
Figure 2D:
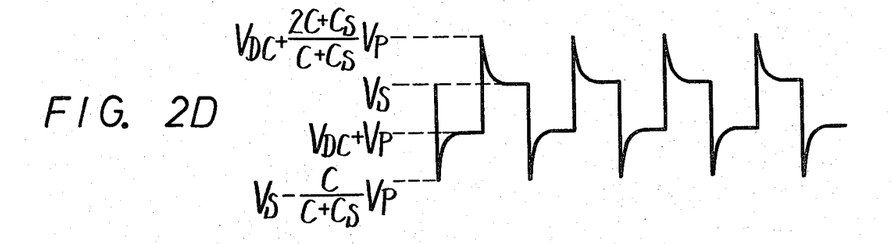

However, as is apparent from FIGS. 2A and 2B, the signals $\phi_1$ and $\phi_2$ change between $V_{DC}$ and $V_{DC}+V_P$, so that the center potential thereof will be $V_{DC}+\frac{1}{2}V_P$. On the other hand, the signal $V_S$ at the hot side of capacitor $C_0$ changes between $$V_{DC} + V_P \text{ and } V_{DC} + \frac{2C + C_S}{C + C_S} V_P,$$

so that the center potential thereof will be $$V_{DC} + V_P + \frac{1}{2} \cdot \frac{C}{C + C_S} V_P.$$

Accordingly, in this circuit, the center potential of signals $\phi_1$ and $\phi_2$ and the center potential of the signal at the hot side of capacitor $C_0$ can not both be set at $V_{CC}/2$, and hence the efficiency of each device can not be utilized to the utmost.

As described above, the circuit of FIG. 1 thus has the following drawbacks: the dynamic range of the input signal is small, mutual interference is large, and the efficiency of each device can not be utilized to the maximum if the device is used in a recursive-type filter.

Figure 3:
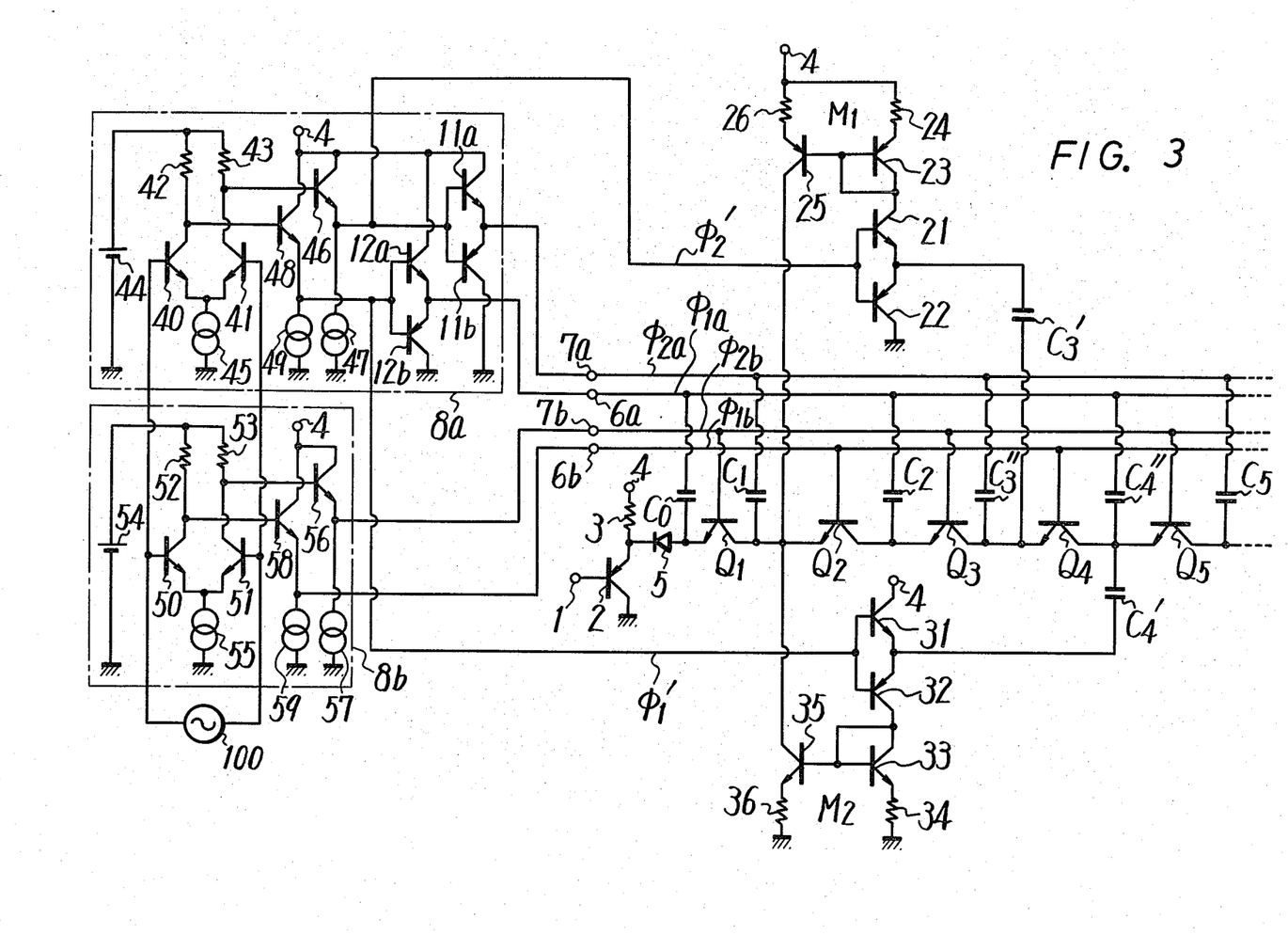
FIG. 3 is a schematic diagram showing one example of a bucket brigaded device according to this invention.

In order to eliminate the above defects with a simplified construction, an embodiment of this invention will hereinafter be described with reference to FIG. 3 et seq. In the circuit of FIG. 3, elements corresponding to those of FIG. 1 are identified by the same reference letters and numerals with their detailed description being omitted.

In FIG. 3, as distinguished from the construction of FIG. 1, the bases of transistors $Q_1$, $Q_2$–$Q_{2n}$ are separated from the cold sides of capacitors $C_0$, $C_1$–$C_{2n}$. The cold sides of capacitors $C_1$, $C_3$–$C_{2n-1}$ are connected through a clock terminal 7a to a clock signal generator 8a, and the cold sides of capacitors $C_0$, $C_2$–$C_{2n}$ are connected through a clock terminal 6a to the clock signal generator 8a. The bases of transistors $Q_1$, $Q_3$–$Q_{2n-1}$ are connected through a clock terminal 7b to a clock signal generator 8b, and the bases of transistors $Q_2$, $Q_4$–$Q_{2n}$ are connected through a clock terminal 6b to the clock signal generator 8b.

The clock signal generators 8a and 8b are constructed in the following manner, in one embodiment of the invention.

In the clock signal generator 8a, two oscillating signals with opposite phase obtained from an oscillator 100 are supplied to the bases of differentially connected transistors 40 and 41. In this case, the oscillating signal may be, for example, a sinusoidal wave signal or a signal with a duty cycle of 50%. The collectors of transistors 40 and 41 are connected respectively through resistors 42 and 43 to a DC voltage source 44. The emitters of transistors 40 and 41 are connected to each other and a connection point therebetween is grounded through a constant current source 45. The collector of transistor 41 is then connected to the base of a transistor 46. The collector of transistor 46 is connected to the terminal 4 to which the source voltage $V_{CC}$ is supplied, while the emitter of transistor 46 is grounded through a constant current source 47 and also connected to the bases of transistors 11a and 11b. Also, the collector of transistor 40 is connected to the base of a transistor 48. The collector of transistor 48 is then connected to the terminal 4, while the emitter of transistor 48 is grounded through a constant current source 49 and also connected to the bases of transistors 12a and 12b. A connection point between the emitters of transistors 11a and 11b is connected to terminal 7a, and a connection point between the emitters of transistors 12a and 12b is connected to terminal 6a.

Similarly, in the clocking signal generator 8b, oscillating signals obtained from the oscillator 100 are supplied to the bases of differentially connected transistors 50 and 51. The collectors of transistors 50 and 51 are connected respectively through resistors 52 and 53 to a DC voltage source 54. Also, the emitters of transistors 50 and 51 are connected to each other and a connection point thereof is grounded through a constant current source 55. Further, the collector of transistor 51 is connected to the base of a transistor 56. The collector of transistor 56 is connected to the terminal 4, and the emitter thereof is grounded through a constant current source 57 and also connected to the terminal 7b. The collector of transistor 50 is connected to the base of a transistor 58. The collector of transistor 58 is connected to the terminal 4, while the emitter thereof is grounded through a constant current source 59 and also connected to the terminal 6b.

Figure 4A:
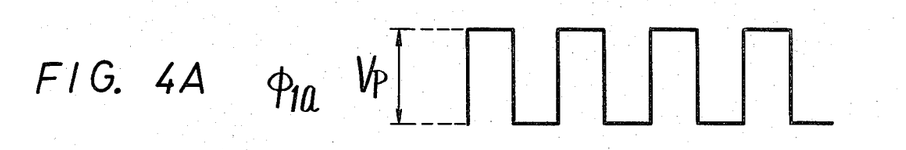
FIGS. 4A to 4F and FIGS. 5A to 5F are views showing waveforms used for explaining the device of FIG. 3.
Figure 4B:
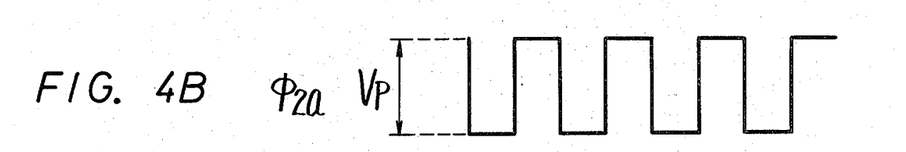

In the above described clocking signal generator 8a, the resistance value of resistors 42 and 43 is taken as $R_a$, and the current value of constant current source 45 as $I_a$. If the values of $R_a$ and $I_a$ are selected so as to satisfy the following equation $$V_P+2V_{BE}=R_a \cdot I_a$$

there are obtained at terminals 6a and 7a clocking signals $\phi_{1a}$ and $\phi_{2a}$, which are $V_P$ in amplitude, 50% in duty cycle, and opposite in polarity to each other as shown in FIGS. 4A and 4B.

Figure 4C:
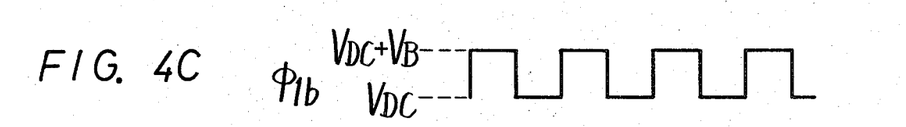
Figure 4D:
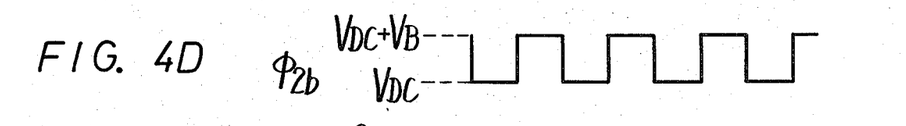

Also, in the clocking signal generator 8b, the resistance value $R_b$ of resistors 52 and 53 and the current value $I_b$ of constant current source 55 are selected so as to satisfy the following relation $$V_B=R_b \cdot I_b$$

where $V_B$ is the amplitude of signals $\phi_{1b}$ and $\phi_{2b}$. If the voltage value $V_b$ of DC voltage source 54 is set at $$V_b=V_{DC}+V_B+V_{BE}$$

there are obtained at terminals 6b and 7b clocking signals $\phi_{1b}$ and $\phi_{2b}$ which are in phase with signals $\phi_{1a}$ and $\phi_{2a}$ and placed at potentials $V_{DC}$ and $V_{DC}+V_B$ as shown in FIGS. 4C and 4D. The signals $\phi_{1b}$ and $\phi_{2b}$ are used to provide the clocking of the BBD and a peak-topeak value $V_B$ of signals $\phi_{1b}$ and $\phi_{2b}$ is selected which is smaller than $V_P$.

Figure 4E:
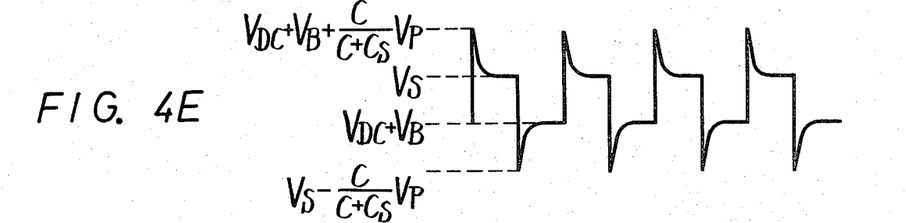

With the above device, the capacitors $C_0$, $C_1$–$C_{2n}$ are initially charged to have a voltage of $$\frac{C}{C + C_S} \cdot V_P$$

each. Accordingly, following the initial state, the potential at the hot sides of even-numbered capacitors $C_0$, $C_2$–$C_{2n}$ is first raised to $$V_{DC} + V_B + \frac{C}{C + C_S} V_P$$

and then falls to $V_{SDC}$ during an interval where signals $\phi_{1a}$ and $\phi_{1b}$ are high in potential, and first falls to $$V_{SDC} - \frac{C}{C + C_S} V_P$$

and then rises to $V_{DC} + V_B$ during an interval where signals $\phi_{2a}$ and $\phi_{2b}$ are high in potential, as shown in FIG. 4E.

Figure 4F:
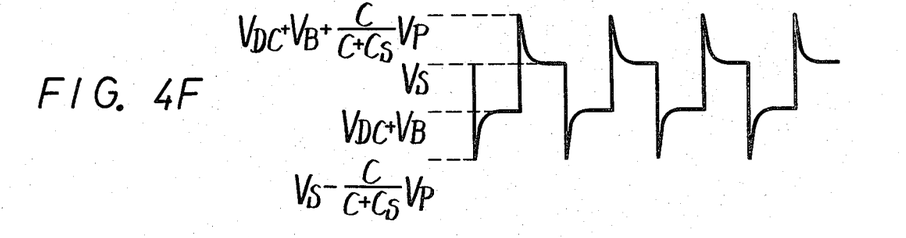

Further, as shown in FIG. 4F, the potential at the hot side of odd-numbered capacitors $C_1$, $C_3$–$C_{2n-1}$ is first lowered to $$V_{SDC} - \frac{C}{C + C_S} V_P$$

and then rises to $V_{DC} + V_B$ during the interval where signals $\phi_{1a}$ and $\phi_{1b}$ are high in potential, and first rises to $$V_{DC} + V_B + \frac{C}{C + C_S} V_P$$

and then falls to $V_{SDC}$ during the interval where signals $\phi_{2a}$ and $\phi_{2b}$ are high in potential.

If the first signal $\phi_{1a}$ and $\phi_{1b}$ immediately after the supply of an input signal $V_S$ are high in potential, and the input signal voltage at this time equals $V_{S1}$, the potential at the hot side of capacitor $C_0$ is first raised to $$V_{DC} + V_B + \frac{C}{C + C_S} V_P$$

and then falls to $V_{S1}$. In other words, the capacitor $C_0$ is discharged to store an electric charge of $\{V_{S1} - (V_{DC} + V_B)\}C$. In this case, the transistor $Q_1$ is nonconductive so that no change occurs in capacitors $C_1$, $C_2$–$C_{2n}$.

Next, during an interval where the signals $\phi_{2a}$ and $\phi_{2b}$ are high in potential, since the potential of signal $\phi_{1a}$ is lowered by $V_P$, the potential at the cold side of capacitor $C_0$ becomes $V_{DC}$ and the potential at the hot side of capacitor $C_0$ becomes $$V_{S1} - \frac{C}{C + C_S} V_P$$

Then, the transistor $Q_1$ is turned on, so that the potential at the hot end side of capacitor $C_0$ is finally raised to the base potential $(V_{DC} + V_B)$ of transistor $Q_1$. At this time, the transistor $Q_1$ is operated in its active region, so that the capacitor $C_0$ is charged through a path from terminal $7a$ though capacitor $C_1$ and the collector emitter junction of transistor $Q_1$ to capacitor $C_0$. Then, since the potential at the hot side of capacitor $C_0$ is changed from $$V_{S1} - \frac{C}{C + C_S} V_P \text{ to } V_{DC} + V_B,$$

the transfer of charge from the hot side of capacitor $C_1$ to the hot side of capacitor $C_0$ is given by $$\left\{ (V_{DC} + V_B) - \left( V_{S1} - \frac{C}{C + C_S} V_P \right) \right\} C =$$

$$\left( V_{DC} + V_B + \frac{C}{C + C_S} V_P - V_{S1} \right).$$

Meanwhile, the capacitor $C_1$ is first storing a charge of $$\frac{C}{C + C_S} V_P \cdot C,$$

so that the final charge of capacitor $C_1$ reaches the amount of $$\frac{C}{C + C_S} V_P \cdot C - (V_{DC} + V_B +$$

$$\frac{C}{C + C_S} V_P - V_{S1})C = \{V_{S1} - (V_{DC} + V_B)\}.$$

That is, the voltage $V_{S1} - (V_{DC} + V_B)$, which appeared across capacitor $C_0$ during the interval where signals $\phi_{1a}$ and $\phi_{1b}$ were high in potential is transferred to capacitor $C_1$ during the interval where signals $\phi_{2a}$ and $\phi_{2b}$ are high in potential, and the capacitor $C_0$ returns to the level of $$\frac{C}{C + C_S} V_P.$$

In this case, the transistor $Q_2$ is nonconductive so that no change appears in capacitors $C_2$, $C_3$–$C_{2n}$.

Further, during the next interval when the signals $\phi_{1a}$ and $\phi_{1b}$ are high in level, if the voltage of the input signal $V_S$ equals $V_{S2}$, the capacitor $C_0$ is charged to a level of $V_{S2} - (V_{DC} + V_B)$, the capacitor $C_1$ is returned to a level of $$\frac{C}{C + C_S} V_P,$$

and the capacitor $C_2$ is charged to a level of $V_{S1} - (V_{DC} + V_B)$. In this case, the transistor $Q_3$ is nonconductive, so that no change appears in capacitors $C_3$ et seq.

When the above operation is repeated the signal is transferred in synchronism with signals $\phi_{1a}$, $\phi_{1b}$, $\phi_{2a}$, and $\phi_{2b}$ from left to right in FIG. 3.

Then, in this circuit, the maximum value of reverse voltage applied between the emitter and base of each of transistors $Q_1$, $Q_2$– becomes as follows:

$$\left(V_{DC} + V_B + \frac{C}{C + C_S} V_P\right) - V_{DC} = V_B + \frac{C}{C + C_S} V_P.$$

Further the reverse breakdown voltage $V_{EBO}$ between the base and emitter of each of transistors $Q_1$, $Q_2$- must satisfy the following equation:

$$V_B + \frac{C}{C + C_S} V_P < V_{EBO}$$

$$V_P < \frac{C + C_S}{C} (V_{EBO} - V_B).$$

The dynamic range $D'$ of the signals flowing through the BBD is expressed as follows:

$$D' = \frac{C}{C + C_S} V_P - V_{CE\ min}.$$

Thus, from the above equations, the following result is obtained $$D' \leq \frac{C}{C + C_S} \cdot \frac{C + C_S}{C} (V_{EBO} - V_B) - V_{CE\ min}$$

$$D' < V_{EBO} - V_B - V_{CE\ min}.$$

In this case, the values of $C_S$, $V_B$ and $V_{CE\ min}$ are small, so that it is possible to obtain a dynamic range which is about twice the dynamic range $D$ of the circuit of FIG. 1, as expressed below:

$$D < \frac{C}{2C + C_S} V_{EBO} - V_{CE\ min}.$$

In this circuit, the clocking signals are supplied to the cold sides of capacitors $C_0$ to $C_{2n}$ and to the bases of transistors $Q_1$ to $Q_{2n}$ through different paths. Therefore, for example, during the interval where signals $\phi_{2a}$ and $\phi_{2b}$ are high in potential and the electric charge is transferred from capacitor $C_3$ to capacitor $C_2$, a signal current flows from terminal $7a$ to terminal $6a$ from capacitor $C_3$ to collector-emitter junction of transistor $Q_3$ to capacitor $C_2$ and the base potentials of transistors $Q_2$, $Q_4$- will not be varied. In this case, the signal current flowing between the collector and emitter of transistor $Q_3$ determines a base current flowing through transistor $Q_3$ equal to $1/h_{fe}$ times the signal current, where $h_{fe}$ is the current amplification factor. Accordingly, in this circuit, mutual interference will seldom occur between signals stored in adjacent capacitors and hence waveform distortion caused by mutual interference or the like is greatly reduced.

Further, in this circuit, if the clocking signals $\phi_{1a}$ and $\phi_{2a}$ supplied to the cold side of the capacitors have the amplitude of $V_P$, the DC level will not affect a signals at the hot side. Accordingly, the DC level of clocking signals $\phi_{1a}$ and $\phi_{2a}$ can be arbitrarily selected so that the center potential of clocking signals $\phi_{1a}$ and $\phi_{2a}$ can be set at VCC/2, that is, an optimum value for driving transistors $11a$, $11b$, $12a$ and $12b$.

The signal $V_S$ at the hot side of capacitor changes from $$V_{DC} + V_B \text{ to } V_{DC} + V_B + \frac{C}{C + C_S} V_P$$

so that the center potential is $$V_{DC} + V_B + \frac{1}{2} \cdot \frac{C}{C + C_S} V_P.$$

Therefore, by setting the peak DC potential $V_{DC} + V_B$ of clocking signals $\phi_{1b}$ and $\phi_{2b}$ at an appropriate value, the center potential of signal $V_S$ can be set at $V_{CC}/2$, that is, an optimum value for driving transistors 25 and 35.

Thus, according to this invention, with a simplified circuit construction, the dynamic range of signal can be enlarged, the mutual interference between signals can be reduced, and the efficiency of the components can be utilized to the utmost limit when a recursive filter is constructed.

FIGS. 5A to 5F show waveforms corresponding to those in FIGS. 4A to 4F in the case that a clocking signal supplied to the BBD has a linear rising or falling portion with an inclination more gradual than that of its corresponding falling or rising portion, and the transfer current through the BBD is thereby made constant. There is proposed a method of driving a BBD in which the clocking signals as mentioned above are used to prevent the energy loss by radiation and the reduction of transfer efficiency.

Figure 5A:
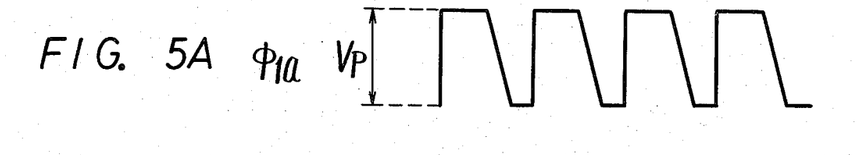
Figure 5B:
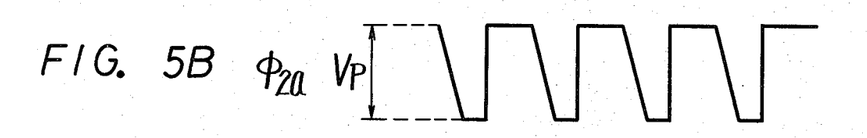
Figure 5C:
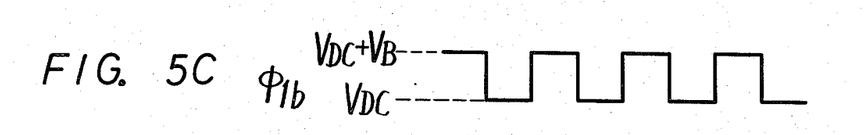
Figure 5D:
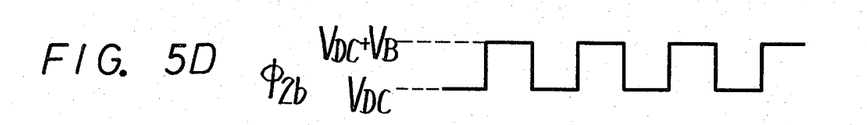
Figure 5E:
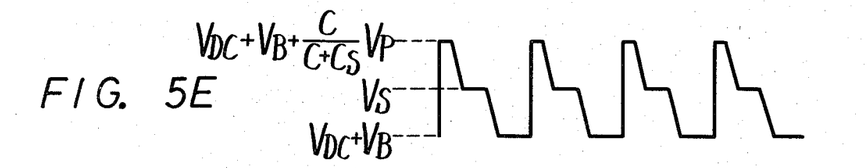
Figure 5F:
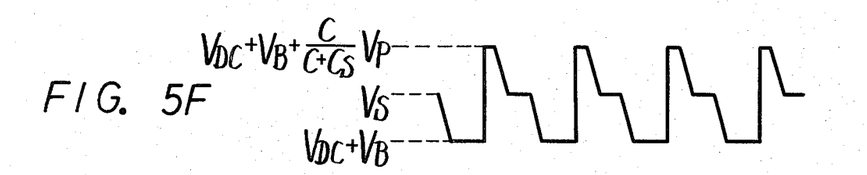

In the case that the above driving method is applied to this invention, only the clocking signals $\phi_{1a}$ and $\phi_{2a}$ supplied to the cold side of the capacitors are arranged to have the inclination of, for example, the falling portion more gentle than that of the rising portion as shown in FIGS. 5A and 5B. According to this driving method, the signals at the hot side of capacitors are varied as shown in FIGS. 5E and 5F and the signal $V_S$ is transferred. By this method the dynamic range can be further increased, the mutual interference can be reduced and the efficiency of device can be made even greater.

Figure 6:
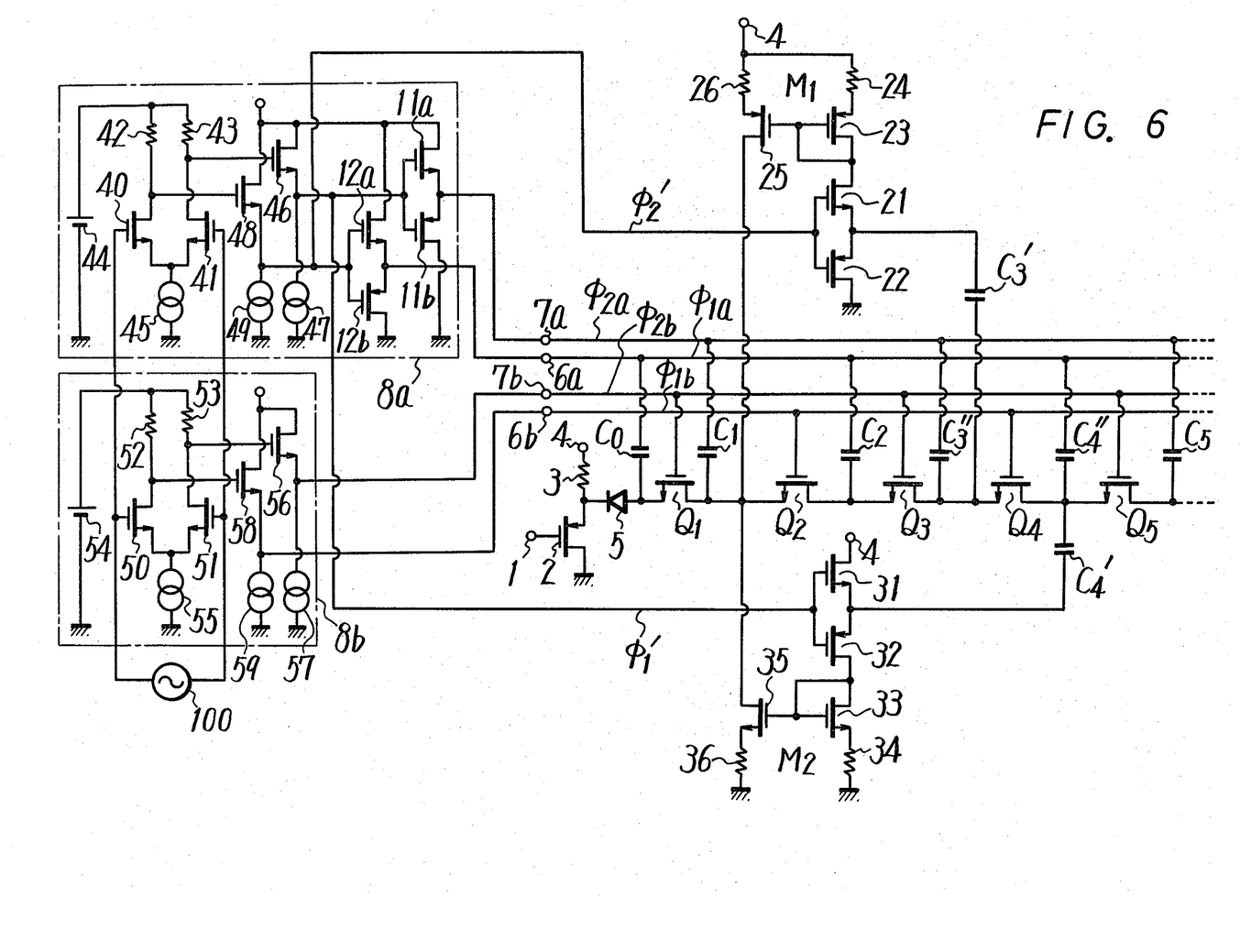
FIG. 6 is a schematic diagram showing another example of a bucket brigaded device according to this invention.

FIG. 6 shows another embodiment of this invention using MOS (metal oxide semiconductor) FETs (field effect transistors). In FIG. 6, the pnp-type transistors are replaced by p-channel FETs and the npn-type transistors by n-channel FETs with the remaining elements being similar to those of FIG. 3. All of elements in FIG. 6 are also represented by the same reference numerals and letters as those of FIG. 3.

In the circuit of FIG. 6, the gate-source voltage drop of each FET $V_{GS}$, the resistance value $R_a$ of resistors 42 and 43, the current value $I_a$ of constant current source 45, the resistance value $R_b$ of resistors 52 and 53, the current value $I_b$ of constant current source 55, and the voltage value $V_b$ of DC voltage source 54 are selected to satisfy the following relations:

$$V_P + 2 V_{GS} = R_a \cdot I_a$$

$$V_B = R_b \cdot I_b$$

$$V_b = V_{DC} + V_B + V_{GS}.$$

Then, the same working effect as in FIG. 3 can be achieved. In this case, scarcely any gate current flows through each FET and hence mutual interference in the BBD can be reduced nearly to zero.

It should be understood that this invention in its broadest aspects is applicable not only to this particular application, but rather to all charge transfer devices utilizing a hithereto imperfect transfer mode.

Thus, the invention is not limited to the precise embodiments described in detail herein, and various changes and variations can be effected by one skilled in the art without departing from the spirit and scope of the novel concepts of the present invention, as defined in the appended claims.

We claim as our invention:

1. A bucket brigaded device comprising:
   a first clocking signal generator for generating as its output a first set of complementary first and second clocking signals of opposite phase;
   a second clocking signal generator for generating as its outputs a second set of complementary first and second clocking signals, said first and second clocking signals of said second set having the same frequency and phase as said first and second clocking signals, respectively, of said first set of clocking signals;
   a series of successive capacitive storage means for sequentially holding a charge level representing a time sampled input signal, each of said capacitive storage means having a clocking electrode;
   a series of transfer gates each including transistor means for controlling the transfer of said charge level between successive ones of said capacitive storage means, each of said transistor means being connected between adjoining capacitive storage means and having a clocking electrode;
   first clocking signal drive means for supplying said first and second clocking signals of said first set to said clockin electrodes of adjacent pairs, respectively, of said capacitive storage means; and
   second clocking signal drive means for supplying said first and second clocking signals of said second set to said clocking electrodes of said transistor means included in adjacent pairs, respectively, of said transfer gates, whereby the levels of said first set of complementary first and second clocking signals can be determined optimally independently of the levels of said second set of complementary first and second clocking signals for increasing the transfer efficiency of said device.

2. A bucket brigaded device according to claim 1; wherein said first clocking signal drive means includes first and second pairs of complementary transistors, each of said complementary transistors has first, second and control electrodes, the control electrodes of said first pair of said complementary transistors are connected together and to one of said outputs of said first clocking signal generator, the control electrodes of said second pair of said complementary transistors are connected together and to the other of said outputs of said first clocking signal generator, the first electrodes of said first pair of complementary transistors are connected together and to the clocking electrodes of one of each of said adjacent pairs of said capacitance storage means, and the first electrodes of said second pair of complementary transistors are connected together and to the clocking electrode of the other of each of said adjacent pairs of said capacitance storage means.

3. A bucket brigaded device according to claim 1; wherein each of said complementary first and second clocking signals of said first and second sets of clocking signals has a high level and a low level, said high level of said complementary first and second clocking signals of said second set is sufficient to make said transistor means conductive and is lower than the high level of said complementary first and second clocking signals of said first set of clocking signals.

4. A bucket brigaded device according to claim 3; wherein each of said first and second clocking signal generators includes a respective differential amplifier having two inputs, each of said inputs being supplied with an oscillating signal having the same frequency as said frequency of said complementary first and second clocking signals of said first and second sets thereof.

* * * * *